_(12)_ United States Patent
Saito et al.

(10) Patent No.: US 6,938,232 B2
(45) Date of Patent: Aug. 30, 2005

(54) FLOORPLANNING APPARATUS DECIDING FLOOR PLAN USING LOGIC SEEDS ASSOCIATED WITH HIERARCHICAL BLOCKS

(75) Inventors: Ken Saito, Tokyo (JP); Yoshio Inoue, Tokyo (JP); Kazuhiro Takahashi, Tokyo (JP); Koji Hirakimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 245 days.

(21) Appl. No.: 10/320,635

(22) Filed: Dec. 17, 2002

(65) Prior Publication Data

US 2003/0229874 A1 Dec. 11, 2003

(30) Foreign Application Priority Data

Jun. 5, 2002 (JP) ........................................ 2002-164708

(51) Int. Cl.[7] .............................................. G06F 17/50
(52) U.S. Cl. .................................................. 716/8; 716/9
(58) Field of Search ........................... 716/8–14, 16–18

(56) References Cited

U.S. PATENT DOCUMENTS 5,696,693 A * 12/1997 Aubel et al. ................... 716/8
6,249,902 B1 * 6/2001 Igusa et al. ................... 716/10
6,292,929 B2 * 9/2001 Scepanovic et al. .......... 716/14
6,519,749 B1 * 2/2003 Chao et al. ..................... 716/9
6,567,967 B2 * 5/2003 Greidinger et al. ........... 716/10
6,578,183 B2 * 6/2003 Cheong et al. ................. 716/7

FOREIGN PATENT DOCUMENTS

JP 63-308676 12/1988
JP 2002-7497 1/2002

* cited by examiner

*Primary Examiner*—Stacy A. Whitmore
*Assistant Examiner*—Binh Tat
(74) *Attorney, Agent, or Firm*—Burns, Doane, Swecker & Mathis, LLP

(57) ABSTRACT

A floorplanning apparatus includes a seed position decision section for deciding a placement position of a logic seed of each hierarchical block; a cell placement section for placing cells belonging to the hierarchical block around the placement position of each logic seed; and a placement region decision section for deciding placement and routing regions of each hierarchical block considering cell placement results produced by the cell placement section.

14 Claims, 11 Drawing Sheets

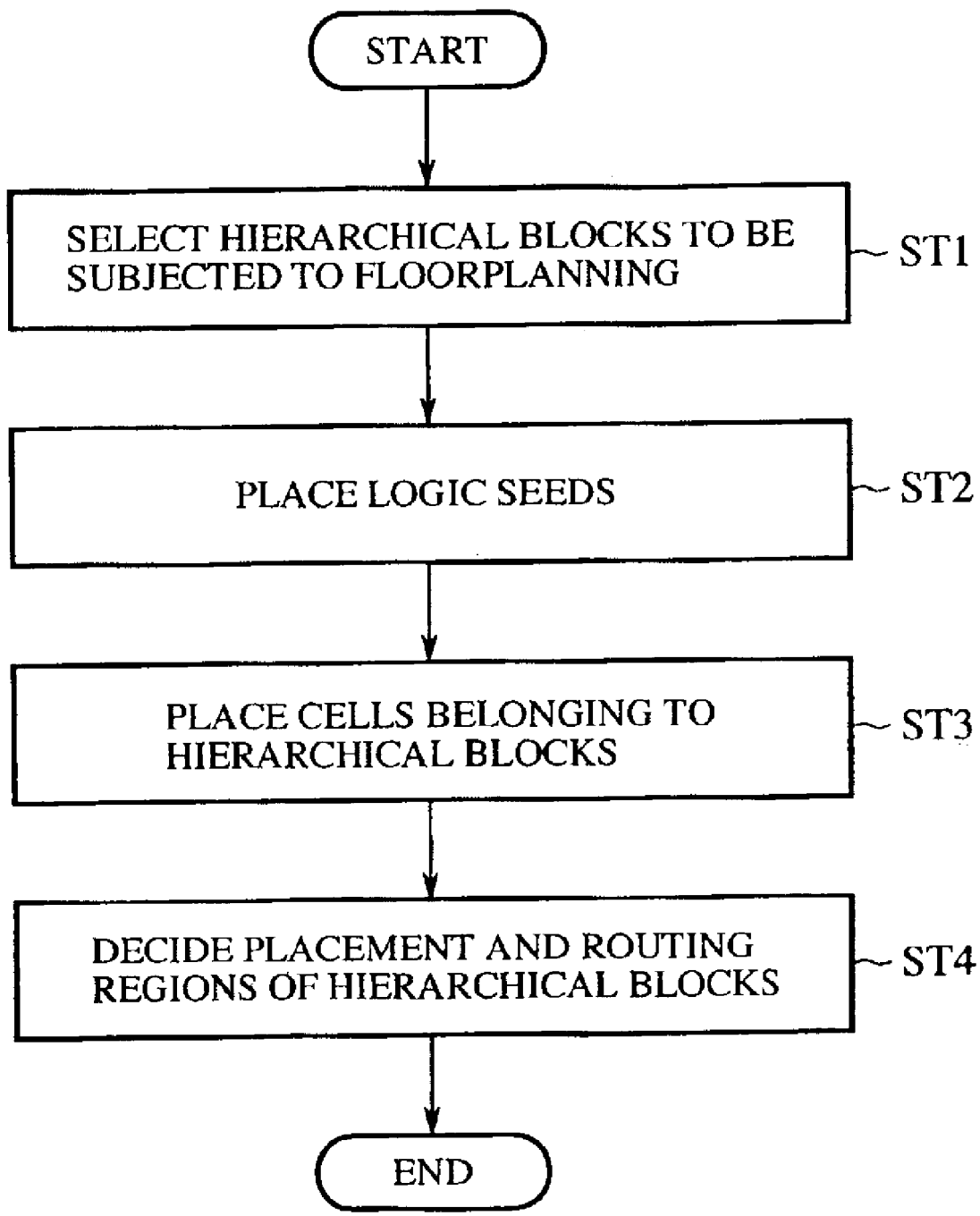

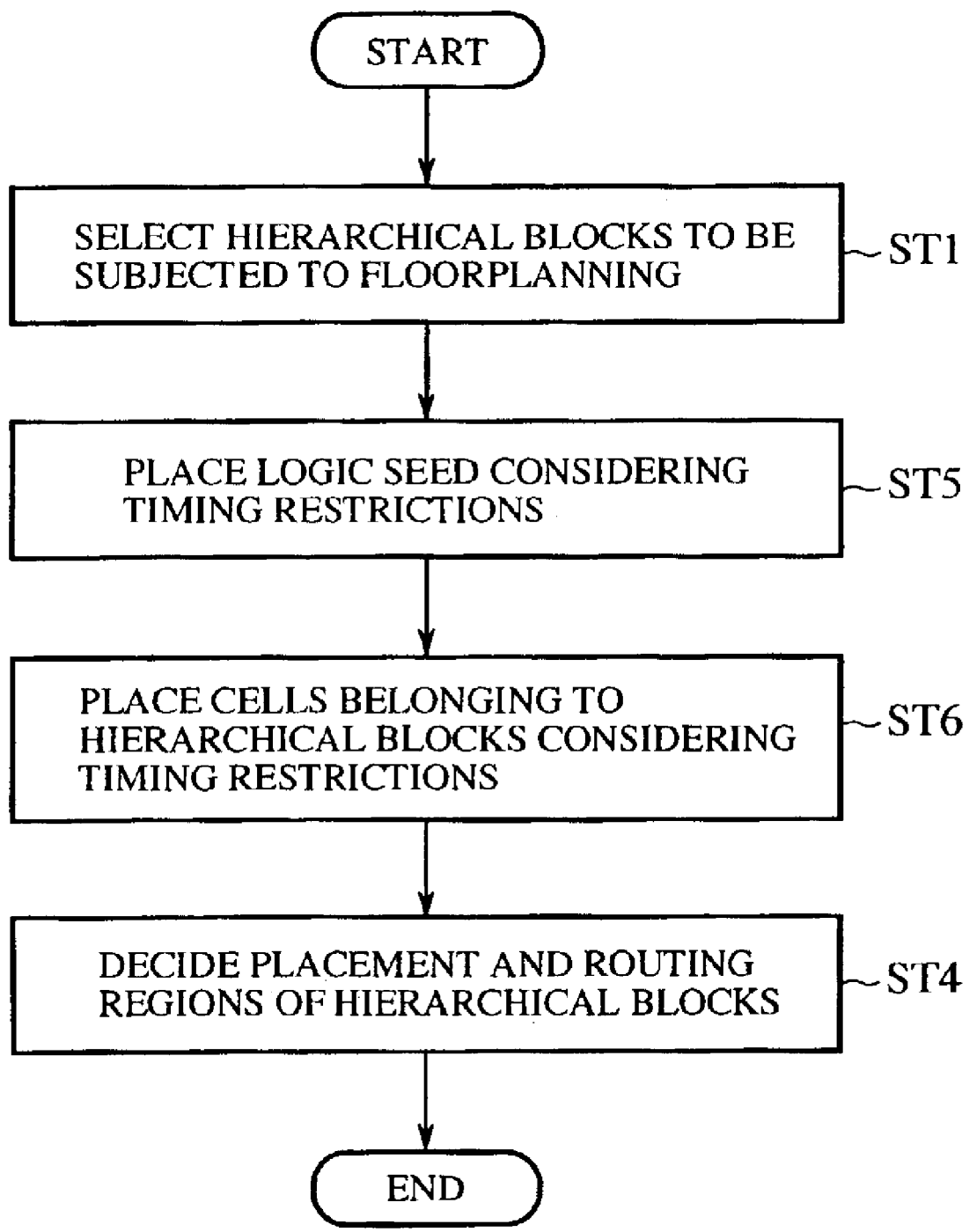

US 6,938,232 B2

FLOORPLANNING APPARATUS DECIDING FLOOR PLAN USING LOGIC SEEDS ASSOCIATED WITH HIERARCHICAL BLOCKS

BACKGROUND OF THE INVENTION

1. Field of the Invention

The present invention relates to a floorplanning apparatus for deciding placement and routing regions of hierarchical blocks.

2. Description of Related Art

A lot of semiconductor integrated circuit devices achieve their intended functions using cells which constitute logic circuits such as AND circuits or OR circuits, flip-flops and memory circuits. These cells are subjected to placement on an integrated circuit substrate and to routing across their terminals according to a netlist.

Recently, an increasing number of cells can be mounted on a single chip thanks to improvements in the microfabrication technology of semiconductor manufacturing. Accordingly, the floorplanning, which divides the whole semiconductor integrated circuit to several hierarchical blocks and decides the placement and routing regions of the individual hierarchical blocks, is increasing its importance. Once the floorplanning has been decided, since the design of the individual hierarchical blocks can be made in parallel, the design period can be reduced considerably.

FIG. 11 is a block diagram showing a processing of a conventional floorplanning apparatus. In FIG. 11, the reference numeral 1 designates a database including a netlist (containing information about cells constituting a semiconductor integrated circuit, information indicating hierarchical blocks including the cells, and information representing interconnections between terminals of the cells). The reference numeral 2 designates a database storing library data about a chip substrate and a cell structure; and 3 designates a floorplanning apparatus. The floorplanning apparatus includes a hierarchical block selecting section 4 for accepting selecting hierarchical blocks to be subjected to placement and routing, and a placement region deciding section 5 for accepting specifying the placement and routing regions of the hierarchical blocks. The reference numeral 6 designates a memory for storing the placement and routing regions of the hierarchical blocks. The reference numeral 7 designates a placement-and-routing/circuit optimizing section for deciding optimum placement of the cells belonging to the hierarchical blocks according to the placement and routing regions of the hierarchical blocks stored in the memory 6. The reference numeral 8 designates a memory for storing placement and routing results produced by the placement-and-routing/circuit optimizing section 7.

Next, the operation of the conventional floorplanning apparatus will be described.

When deciding the placement and routing regions of the hierarchical blocks, the floorplanning apparatus 3 reads the netlist from the database 1 and the library data from the database 2, and displays them.

Referring to the netlist and library data the floorplanning apparatus 3 displays, a designer selects hierarchical blocks to be subjected to the placement and routing from among a plurality of hierarchical blocks. Specifically, operating the hierarchical block selecting section 4 of the floorplanning apparatus 3, the designer selects the hierarchical blocks to be subjected to the placement and routing.

After selecting them, the designer decides the placement and routing regions of the hierarchical blocks according to his or her expertise. Specifically, the designer designates the placement and routing regions of the hierarchical blocks by operating the placement region deciding section 5 of the floorplanning apparatus 3.

The memory 6 stores the information about the placement and routing regions of the hierarchical blocks output from the floorplanning apparatus 3. Then referring to the information stored, the placement-and-routing/circuit optimizing section 7 decides the optimum placement of the cells belonging to the hierarchical blocks and the optimum routing across the terminals of the individual cells, and stores the placement and routing results into the memory 8. Although the optimization processing of the placement and routing is carried out according to the netlist and the like stored in the databases 1 and 2, the optimization processing itself belongs to a common conventional technique.

When the memory 8 stores the placement and routing results output from the placement-and-routing/circuit optimizing section 7, the designer verifies the placement and routing results. When the placement and routing results have a problem, the designer alters the placement and routing regions of the hierarchical blocks by operating the placement region deciding section 5.

The conventional floorplanning apparatus with the foregoing configuration has a problem of taking a long time for obtaining a floor plan enabling actual placement and routing. This is because it is necessary for the designer to iterate the designation of the placement and routing regions of the hierarchical blocks, and for the placement-and-routing/circuit optimizing section 7 to iterate the optimization processing. In addition, it has another problem of requiring excellent engineers with rich experience to obtain quality floor plan.

SUMMARY OF THE INVENTION

The present invention is implemented to solve the foregoing problems. It is therefore an object of the present invention to provide a floorplanning apparatus capable of obtaining a floorplan enabling the placement and routing quickly.

According to one aspect of the present invention, there is provided a floorplanning apparatus including a seed position decision section for deciding a placement position of a logic seed of each hierarchical block; a cell placement section for placing cells belonging to the hierarchical block around the placement position of each logic seed; and a placement region decision section for deciding placement and routing regions of each hierarchical block considering cell placement results produced by the cell placement section. Thus, it offers an advantage of being able to quickly generating a floorplan enabling automatic placement and routing.

BRIEF DESCRIPTION OF THE DRAWINGS

FIG. 2 is a flowchart illustrating processing of the embodiment 1 of the floorplanning apparatus in accordance with the present invention;

FIG. 4 is a flowchart illustrating processing of an embodiment 2 of the floorplanning apparatus in accordance with the present invention;

DETAILED DESCRIPTION OF THE PREFERRED EMBODIMENTS

The invention will now be described with reference to the accompanying drawings.

Embodiment 1

Figure 1:
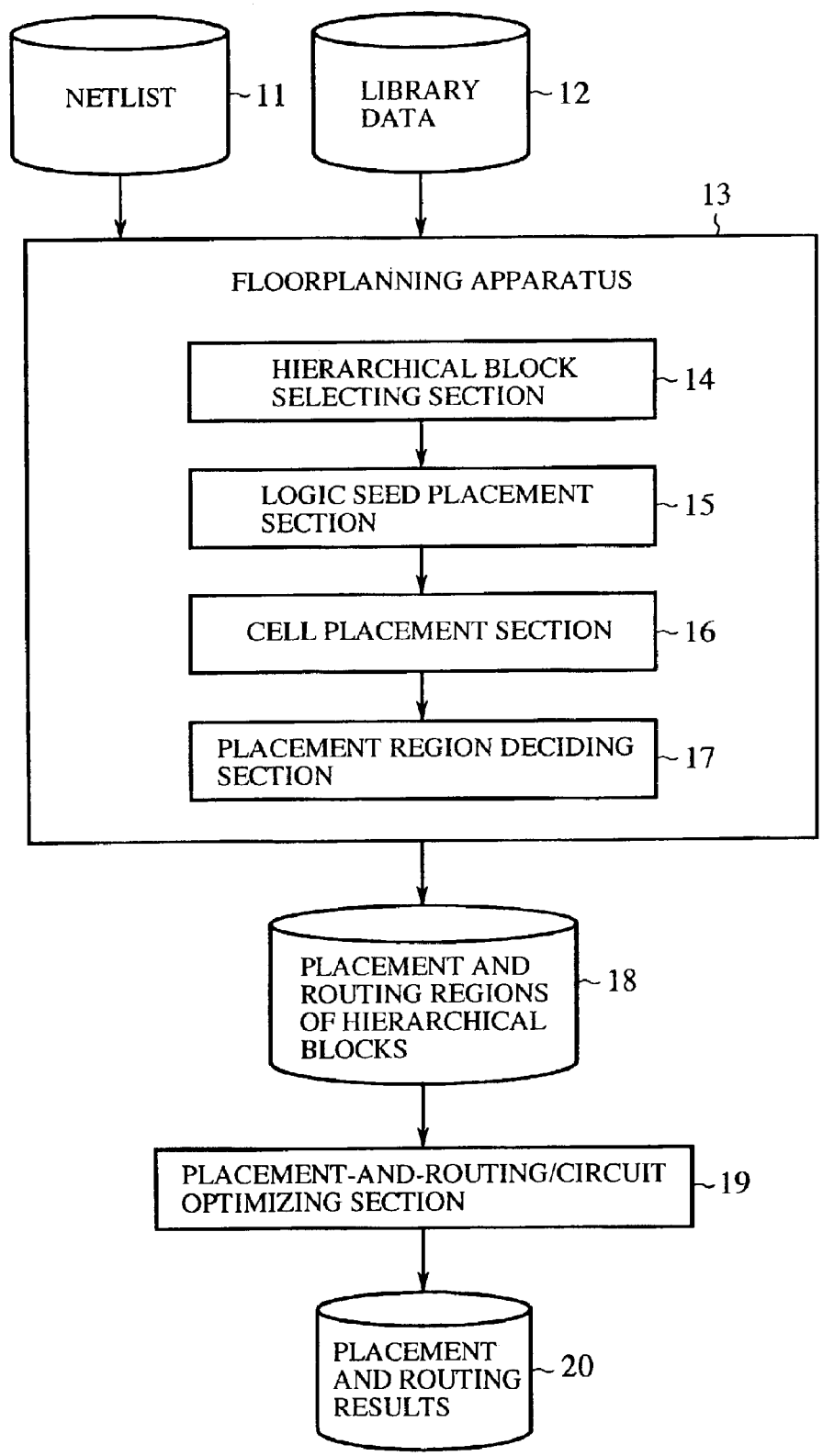
FIG. 1 is a block diagram showing a configuration of an embodiment 1 of the floorplanning apparatus in accordance with the present invention.

FIG. 1 is a block diagram showing a configuration of an embodiment 1 of the floorplanning apparatus in accordance with the present invention. In FIG. 1, the reference numeral 11 designates a database for storing a netlist, that is, circuit information about hierarchical blocks constituting a semiconductor integrated circuit (such as information about cells constituting the semiconductor integrated circuit, information indicating the hierarchical blocks to which the cells belong, and information indicating interconnections between the terminals of the cells); 12 designates a database for storing library data concerning a chip substrate and cell structures as circuit information of the hierarchical blocks; and 13 designates a floorplanning apparatus.

The floorplanning apparatus 13 comprises a hierarchical block selecting section 14, a logic seed placement section 15, a cell placement section 16 and a placement region deciding section 17. The hierarchical block selecting section 14, referring to the netlist stored in the database 11 and the library data stored in the database 12, selects the hierarchical blocks to be subjected to the placement and routing. The logic seed placement section 15, referring to the netlist and library data of the hierarchical blocks selected by the hierarchical block selecting section 14, decides the placement positions of the logic seeds associated with the hierarchical blocks. The cell placement section 16, referring to the netlist and library data about the hierarchical blocks corresponding to the logic seeds, places the cells belonging to the hierarchical blocks in regions around the placement positions of the logic seeds decided by the logic seed placement section 15. The placement region deciding section 17 decides the placement and routing regions of the individual hierarchical blocks considering the cell placement results produced by the cell placement section 16.

The reference numeral 18 designates a memory for storing the placement and routing regions of the hierarchical blocks. The reference numeral 19 designates a placement-and-routing/circuit optimizing section that referring to the placement and routing regions of the hierarchical blocks stored in the memory 18, decides the optimum placement of the cells belonging to the hierarchical blocks. The reference numeral 20 designates a memory for storing the placement and routing results produced by the placement-and-routing/circuit optimizing section 19.

Figure 3A:
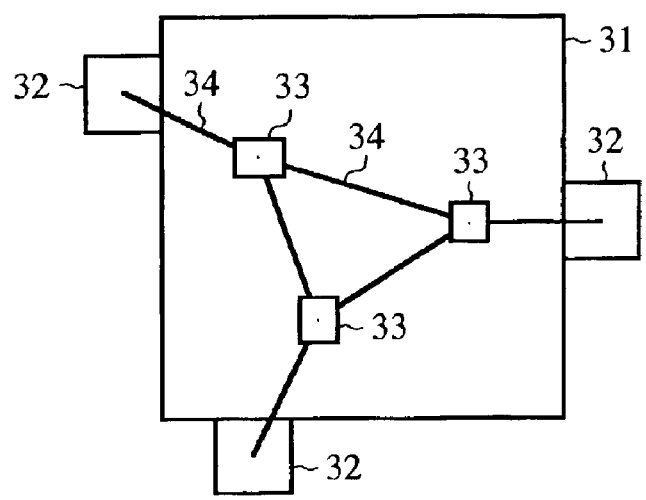
FIGS. 3A–3C are block diagrams each showing processing results of the floorplanning apparatus.
Figure 3B:
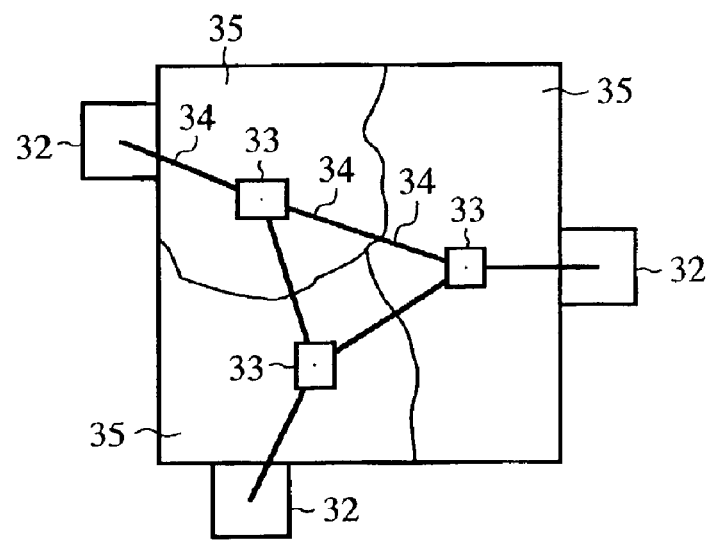
Figure 3C:
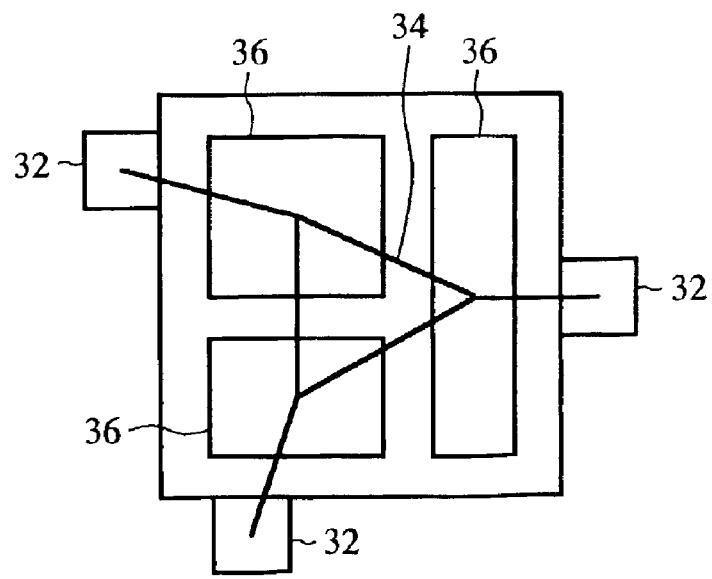

FIG. 2 is a flowchart illustrating processing of the embodiment 1 of the floorplanning apparatus in accordance with the present invention; and FIGS. 3A–3C are block diagrams each showing processing results of the floorplanning apparatus. In FIGS. 3A–3C, the reference numeral 31 designates a semiconductor integrated circuit substrate, each reference numeral 32 designates an input/output cell, 33 designates a logic seed, and 34 designates a netlist indicating the connection relationship between the hierarchical blocks. Each reference numeral 35 designates a present area of the cells belonging to each hierarchical block, and 36 designates a placement and routing region of each hierarchical block.

Next, the operation of the present embodiment 1 will be described.

First, referring to the netlist stored in the database 11 and the library data stored in the database 12, the hierarchical block selecting section 14 of the floorplanning apparatus 13 selects the hierarchical blocks to be subjected to the placement and routing, and supplies the netlist and library data of the hierarchical blocks to the logic seed placement section 15 (step ST1).

The databases 11 and 12 contain mixed information consisting of the netlist about general subdivisions and detailed subdivisions of the semiconductor integrated circuit. Thus, to decide the placement and routing regions of the hierarchical blocks of the most general subdivisions of the semiconductor integrated circuit, the hierarchical block selecting section 14 selects the hierarchical blocks of the most general subdivisions, and supplies the netlist and library data of the hierarchical blocks to the logic seed placement section 15.

Receiving the netlist and library data of the hierarchical blocks selected by the hierarchical block selecting section 14, the logic seed placement section 15, referring to the netlist and library data of the hierarchical blocks, decides the placement positions of the logic seeds 33 associated with the hierarchical blocks as illustrated in FIG. 3A (step ST2).

In this case, to increase the flexibility of the placement of the logic seeds 33 on the semiconductor integrated circuit substrate 31, that is, to enable the individual logic seeds 33 to be placed without considering the interference with other logic seeds 33, it is necessary to place the logic seeds 33 whose sizes are small enough compared with the size of the semiconductor integrated circuit substrate 31. The present embodiment 1 employs, for example, the logic seeds with a size smaller than a mesh size of a grid used for the placement and routing of the cells. However, they are only an example, and the logic seeds 33 whose sizes are greater than the mesh size of the grid can also be used as long as they are small enough as compared with the semiconductor integrated circuit substrate 31.

A decision of the placement positions of the logic seeds 33 is made as follows, for example.

The logic seed placement section 15 recognizes the number of signal lines across the individual hierarchical blocks from the netlist about the hierarchical blocks. Placing two hierarchical blocks with a large number of signal lines distantly will increase an occupied area. Accordingly, they are placed as close as possible to each other. On the other hand, two hierarchical blocks which have a small number of signal lines but are critical about signal delay between them are also placed as close as possible. In this way, a decision of the placement positions of the logic seeds 33 is made considering the number of signal lines and allowable signal delay.

Once the logic seed placement section 15 decides the placement positions of the logic seeds 33, the cell placement section 16 places the cells belonging to the hierarchical blocks around the placement positions of the logic seeds 33 as illustrated in FIG. 3B (step ST3). It carries out the placement referring to the netlist and library data of the hierarchical blocks corresponding to logic seeds 33. Thus, one or more cells belonging to each hierarchical block are placed in the present area 35 of the cells around the placement position of the corresponding logic seed 33.

The decision of the placement positions of the cells belonging to the hierarchical blocks is made in the same manner as the logic seed placement section 15 makes its decision considering the number of signal lines and allowable signal delay between the individual cells.

Once the cell placement section 16 decides the placement of the cells belonging to the hierarchical blocks, the placement region deciding section 17 decides the placement and routing regions of the individual hierarchical blocks 36 as illustrated in FIG. 3C considering the cell placement results produced by the cell placement section 16 (step ST4).

More specifically, it decides the individual placement and routing regions 36 such that they include the cells belonging to the hierarchical blocks as many as possible. However, depending on the placement positions of the cells, it is not unlikely that some cells are included in the placement and routing regions 36 associated with other hierarchical blocks.

When the floorplanning apparatus 13 has decided the placement and routing regions of the hierarchical blocks 36 and stored the information about them in the memory 18, the placement-and-routing/circuit optimizing section 19 carries out the following processing. That is, referring to the placement and routing regions of the hierarchical blocks 36, it decides the optimum placement of the cells belonging to the hierarchical blocks and the optimum routing across the terminals of the individual cells, and stores the placement and routing results in the memory 20. In this case, it carries out the optimization processing of the placement and routing referring to the netlist and the like stored in the databases 11 and 12, which optimization processing itself is an ordinary existing method.

As described above, the present embodiment 1 is configured such that it decides the placement positions of the logic seeds 33 associated with the individual hierarchical blocks, places the cells belonging to the hierarchical blocks around the placement positions of the logic seeds 33, and decides the placement and routing regions of the individual hierarchical blocks 36 considering the cell placement results. Accordingly, it offers an advantage of being able to quickly produce a floor plan enabling automatic placement and routing.

Embodiment 2

Although not mentioned in the embodiment 1, the netlist stored in the database 11 can include timing restrictions on signal delays between the cells. In this case, as shown in FIG. 4, the seed placement section 15 can decide the placement positions of the logic seeds 33 considering the timing restrictions (step ST5), and the cell placement section 16 can place the cells considering the timing restrictions (step ST6).

For example, when the signal delay between a first couple of hierarchical blocks is more critical than the signal delay between a second couple of hierarchical blocks, the logic seed placement section 15 decides the placement positions of the logic seeds 33 such that the signal lines across the first couple become shorter than the signal lines across the second couple.

Likewise, when the signal delay between a first couple of cells is more critical than the signal delay between a second couple of cells, the cell placement section 16 decides the placement positions of the cells such that the signal lines across the first couple become shorter than the signal lines across the second couple.

Thus, the present embodiment 2 offers an advantage of being able to produce a quality floor plan even if the signal lines with a critical signal delay condition are present.

Embodiment 3

Figure 5:
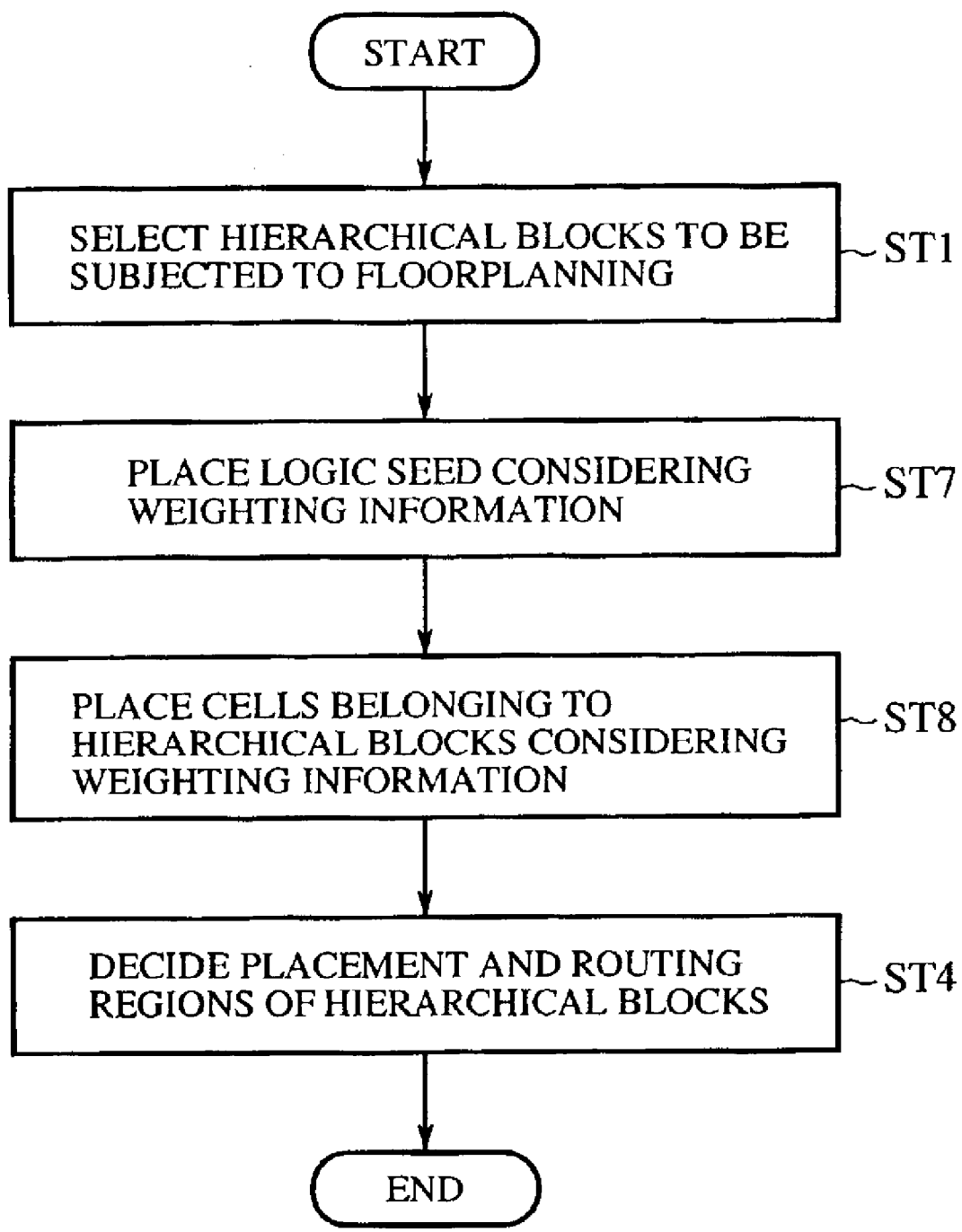
FIG. 5 is a flowchart illustrating processing of an embodiment 3 of the floorplanning apparatus in accordance with the present invention.

Although the foregoing embodiment 2 decides the placement positions of the logic seeds 33 considering the timing restrictions, it is possible to consider other factors in deciding them. For example, when the netlist stored in the database 11 includes additional weighting information for various signals, the logic seed placement section 15 can decide the placement positions of the logic seeds 33 considering the weighting information (step ST7) as shown in FIG. 5. Likewise, the cell placement section 16 can place the cells considering the weighting information (step ST8).

More specifically, even when the timing restrictions are not imposed on the signal lines, it sometimes occurs that weight is added to the important signal lines such as bus lines and clock lines. When the weight is added to the signal lines across a particular couple of two hierarchical blocks, the logic seed placement section 15 of the present embodiment 3 decides the placement positions of the logic seeds 33 such that the signal lines across the particular couple of the two hierarchical blocks become shorter than the signal lines across other hierarchical blocks.

Likewise, when the weight is imposed on signal lines across a particular couple of cells, the cell placement section 16 decides the placement positions of the cells such that the signal lines across the particular couple become shorter than the signal lines across other cells.

Figure 6A:
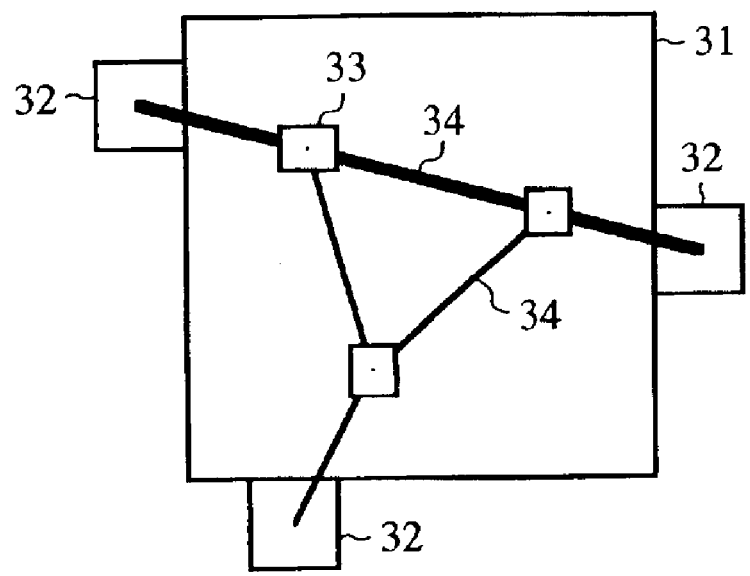
FIGS. 6A–6B are block diagrams each showing processing results of the floorplanning apparatus.

For example, when the netlist 34 denoted by a bold line in FIG. 6A undergoes weighting, the logic seed placement section 15 decides the placement positions of the logic seeds 33 such that the signal lines associated with the netlist 34 denoted by the bold line become shorter.

Figure 6B:
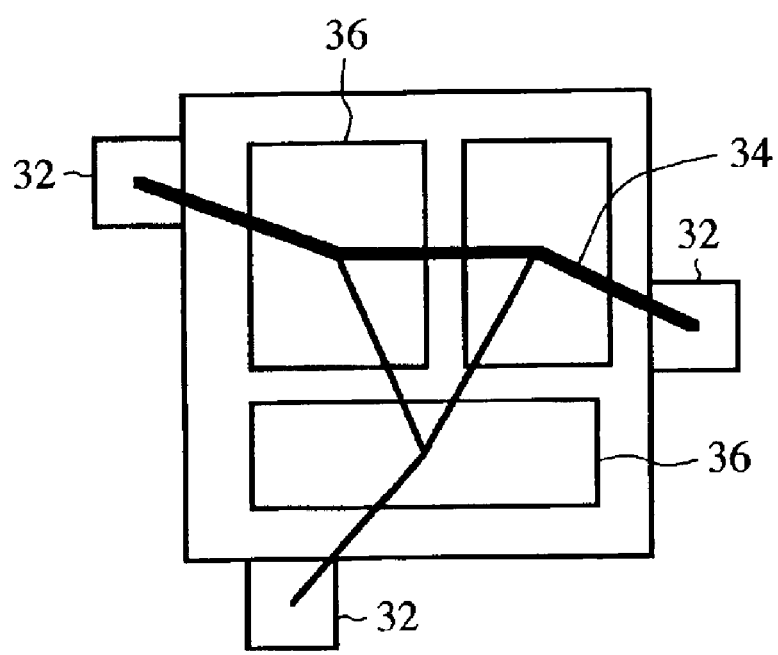
Figure 7:
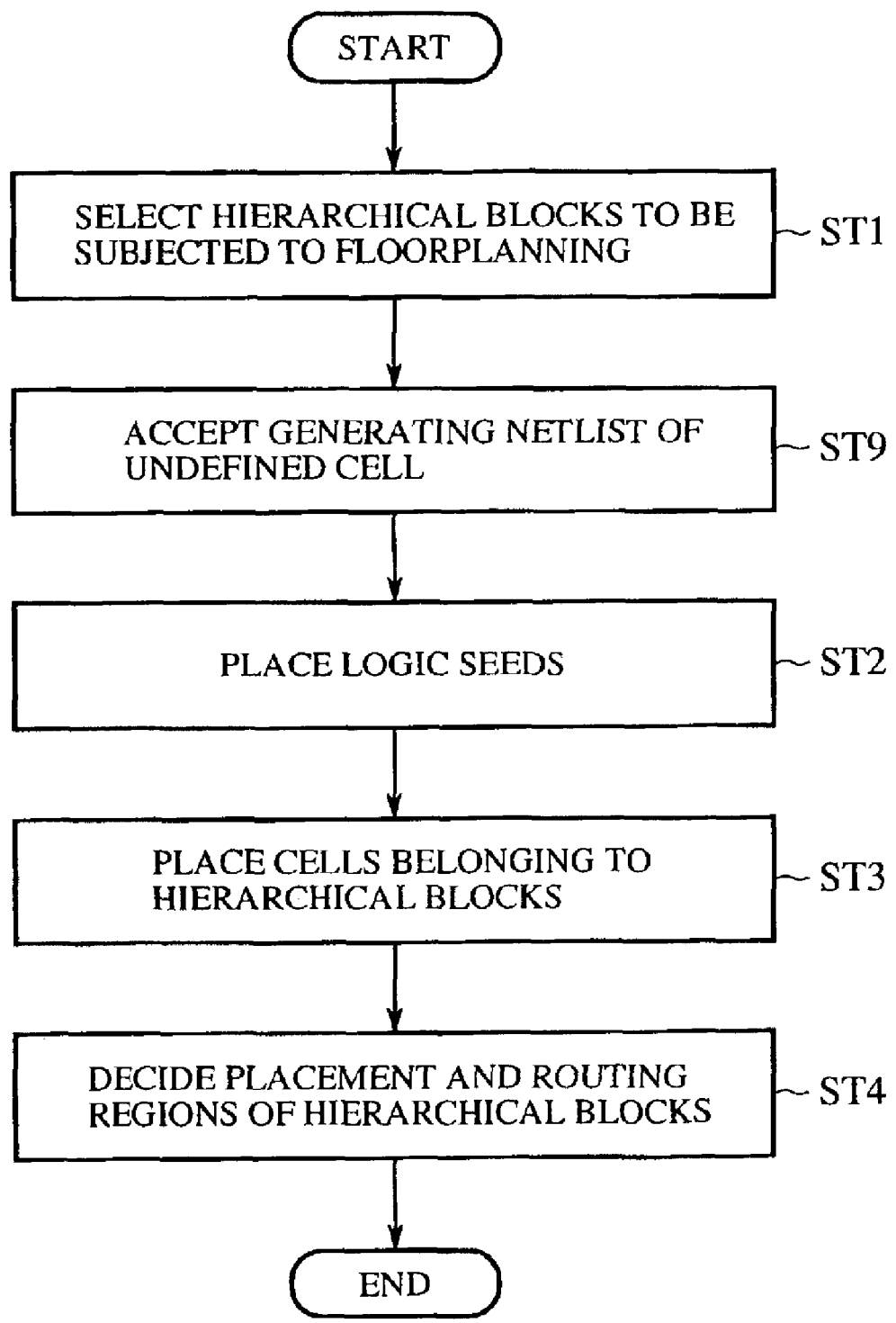
FIG. 7 is a flowchart illustrating processing of an embodiment 4 of the floorplanning apparatus in accordance with the present invention.

FIG. 6B illustrates placement and routing results when the cell placement section 16 decides the placement positions of the cells considering the weight added to the netlist 34 denoted by the bold line, followed by deciding the placement and routing regions of the hierarchical blocks 36.

The present embodiment 3 offers an advantage of being able to provide a quality floor plan even if an important signal line is present.

Embodiment 4

Although not mentioned the foregoing embodiment 1, when the cells belonging to the hierarchical blocks include a cell whose netlist is undefined, the hierarchical block selecting section 14 can accept the generation of the netlist about the undefined cell (step ST9).

Specifically, a configuration can be constructed in which a designer specifies the netlist about the undefined cell by operating the hierarchical block selecting section 14. Thus, the present embodiment 4 offers an advantage of being able to produce a floor plan enabling quick placement and routing even when the cell with an undefined netlist is present.

Embodiment 5

Figure 8:
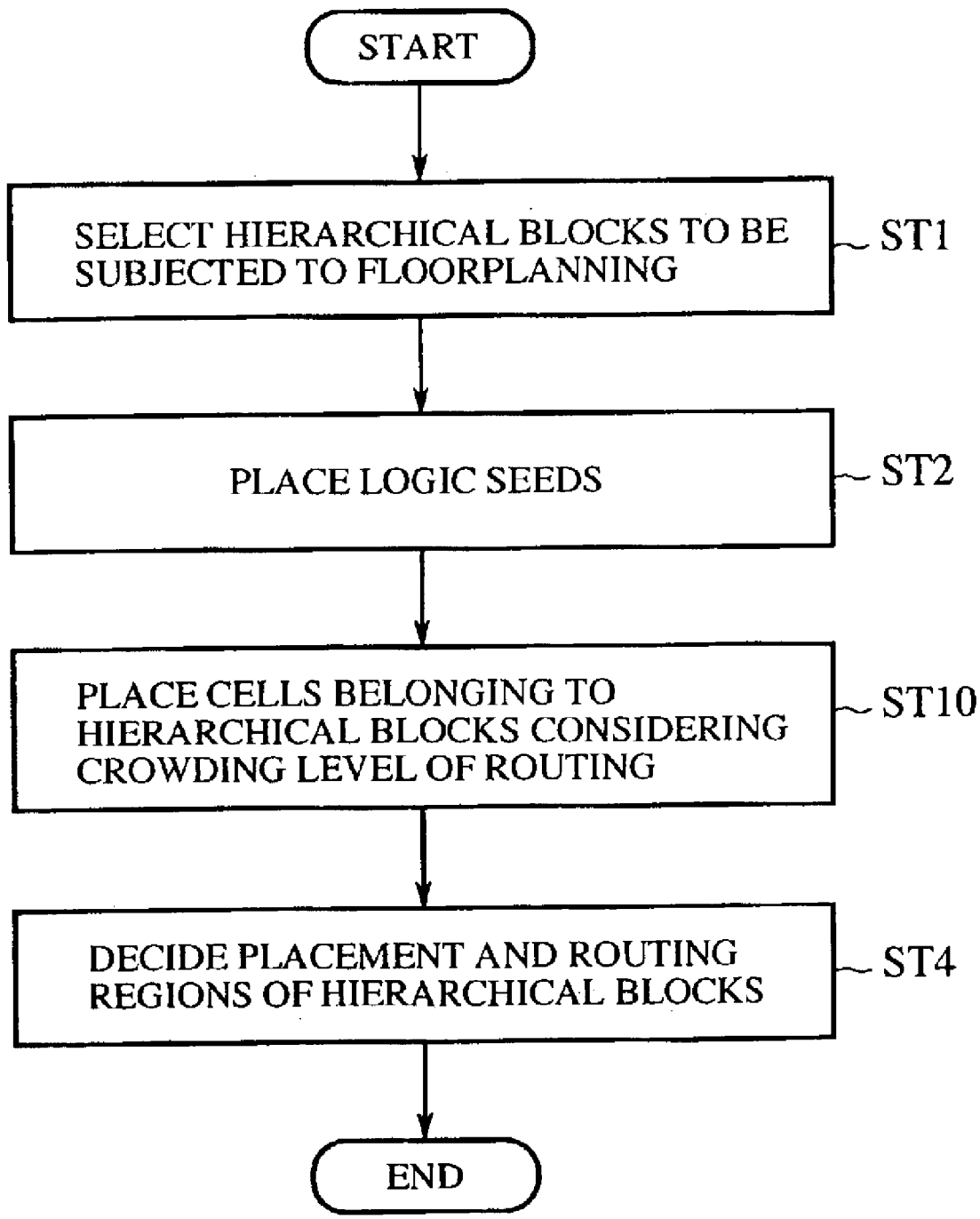
FIG. 8 is a flowchart illustrating processing of an embodiment 5 of the floorplanning apparatus in accordance with the present invention.

Although not mentioned in the foregoing embodiment 1, the cell placement section 16 can recognize a crowding level of wiring referring to the netlist about the hierarchical blocks, and adjust the cell density in accordance with the crowding level of wiring as illustrated in FIG. 8 (step ST10).

Specifically, when the cell placement section 16 places the cells belonging to the hierarchical blocks around the placement positions of the logic seeds 33, it can estimate a location at which the wiring crowds locally referring to the netlist about the hierarchical blocks, and alleviate the wiring aggregation by reducing the cell density at the location.

As a result, the present embodiment 5 offers an advantage of being able to provide a quality floor plan even when the wiring is likely to be crowded locally.

Embodiment 6

Figure 9:
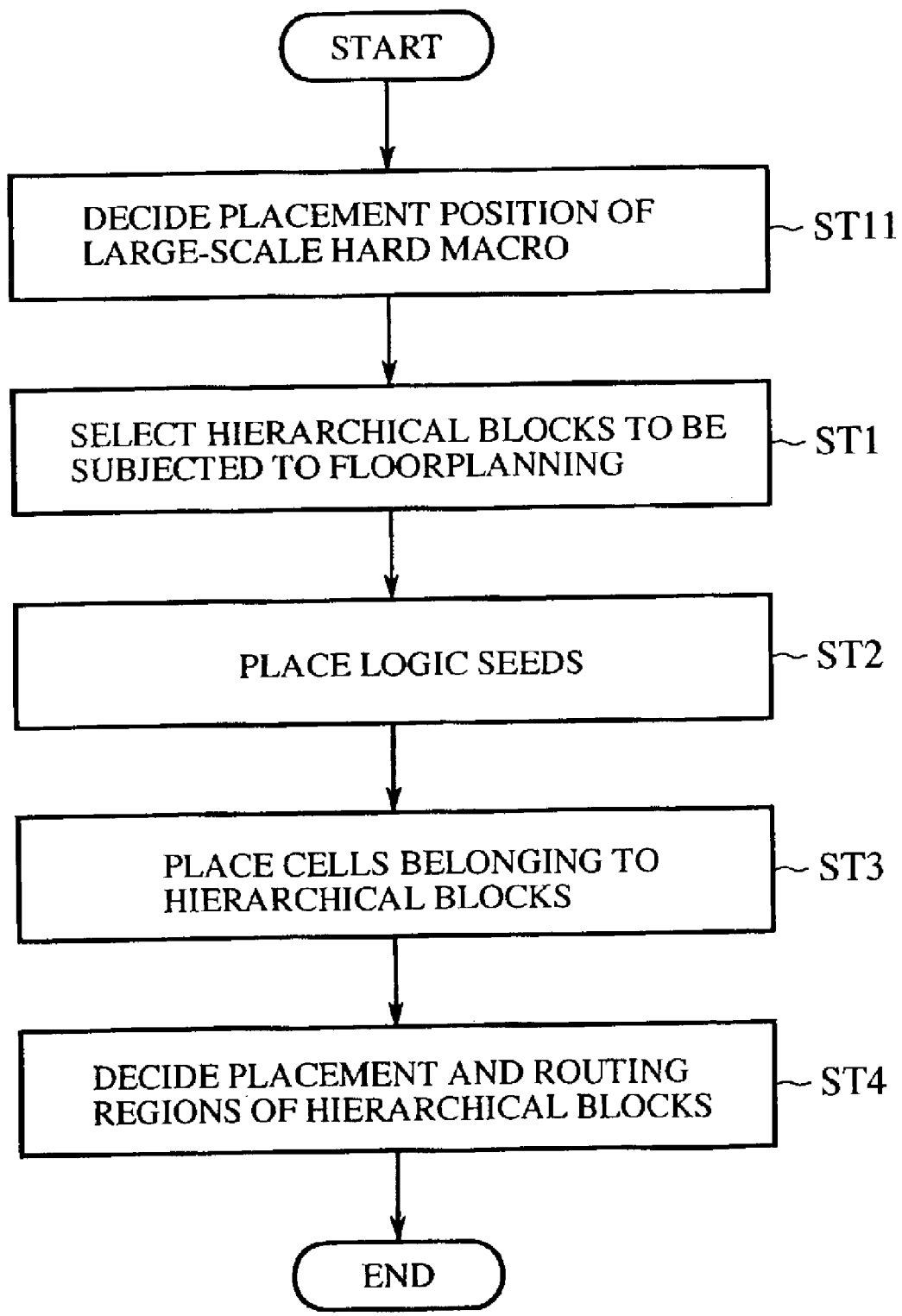
FIG. 9 is a flowchart illustrating processing of an embodiment 6 of the floorplanning apparatus in accordance with the present invention.

Although not mentioned in the foregoing embodiment 1, the netlist stored in the database 11 sometimes includes information indicating that a large-scale hard macro (such as of a memory cell) is present. In this case, as illustrated in FIG. 9, the hierarchical block selecting section 14 temporarily places the hard macro and all its cells on the semiconductor integrated circuit substrate 31 before selecting the hierarchical blocks, and then decides the placement position of the hard macro (step ST11).

Subsequently, the logic seed placement section 15 decides the placement positions of the logic seeds considering the placement position of the hard macro, and the cell placement section 16 decides the cell placement considering the placement position of the hard macro.

Thus, the present embodiment 6 offers an advantage of being able to provide a floor plan enabling the placement and routing even when the netlist stored in the database 11 includes the information indicating that the large-scale hard macro is present.

Embodiment 7

Although the foregoing embodiment 6 decides the placement positions of the logic seeds considering the placement position of the hard macro, this is not essential. For example, it is also possible to generate a hierarchical block equivalent in size to the hard macro, and to carry out the decision of the placement positions of the logic seeds or of the cell placement, followed by replacing the hierarchical block by the hard macro.

More specifically, when the logic seed placement section 15 decides the placement positions of the logic seeds, it generates the hierarchical block with the size nearly equal to the hard macro. Subsequently, handling the hierarchical block in the same manner as the remaining hierarchical blocks, the logic seed placement section 15 decides the placement position of the logic seed associated with the hierarchical block.

After the cell placement section 16 completes the cell placement, it replaces the hierarchical block with nearly the same size as the hard macro by the hard macro.

Thus, the present embodiment 7 offers an advantage of being able to provide a quality placement result of the hard macro.

Embodiment 8

Although not mentioned in the foregoing embodiment 1, the hierarchical block selecting section 14 can select the hierarchical blocks in descending order of the hierarchy. Specifically, it selects the highest level hierarchical blocks, first. Then, after the logic seed placement section 15 to the placement region deciding section 17 complete their processing, the hierarchical block selecting section 14 selects the second highest level hierarchical block. Afterward, after the logic seed placement section 15 to the placement region deciding section 17 complete their processing, it selects the third highest level hierarchical block, thus carrying out the hierarchical blocks in the descending order.

Figure 10:
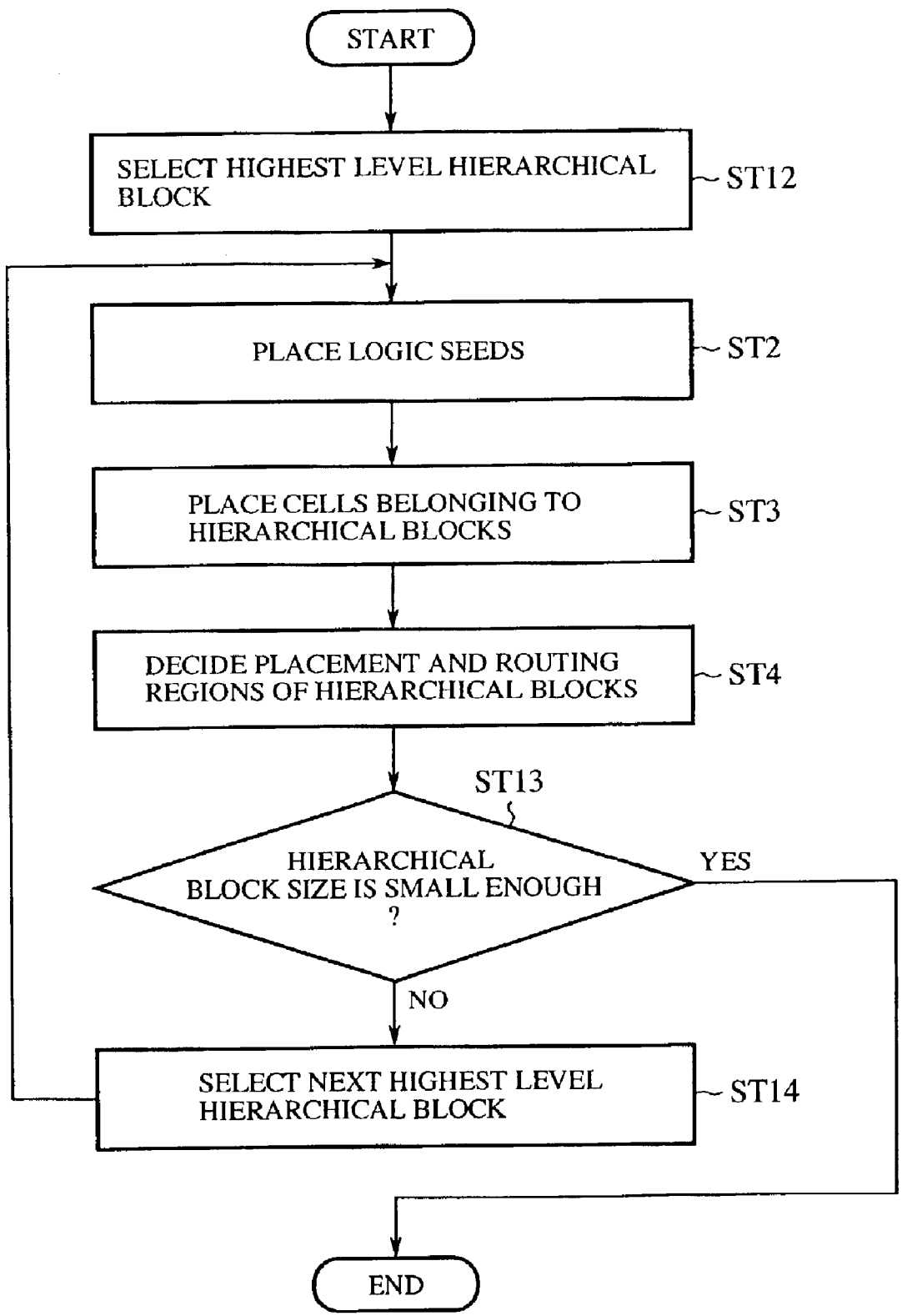
FIG. 10 is a flowchart illustrating processing of an embodiment 8 of the floorplanning apparatus in accordance with the present invention.
Figure 11:
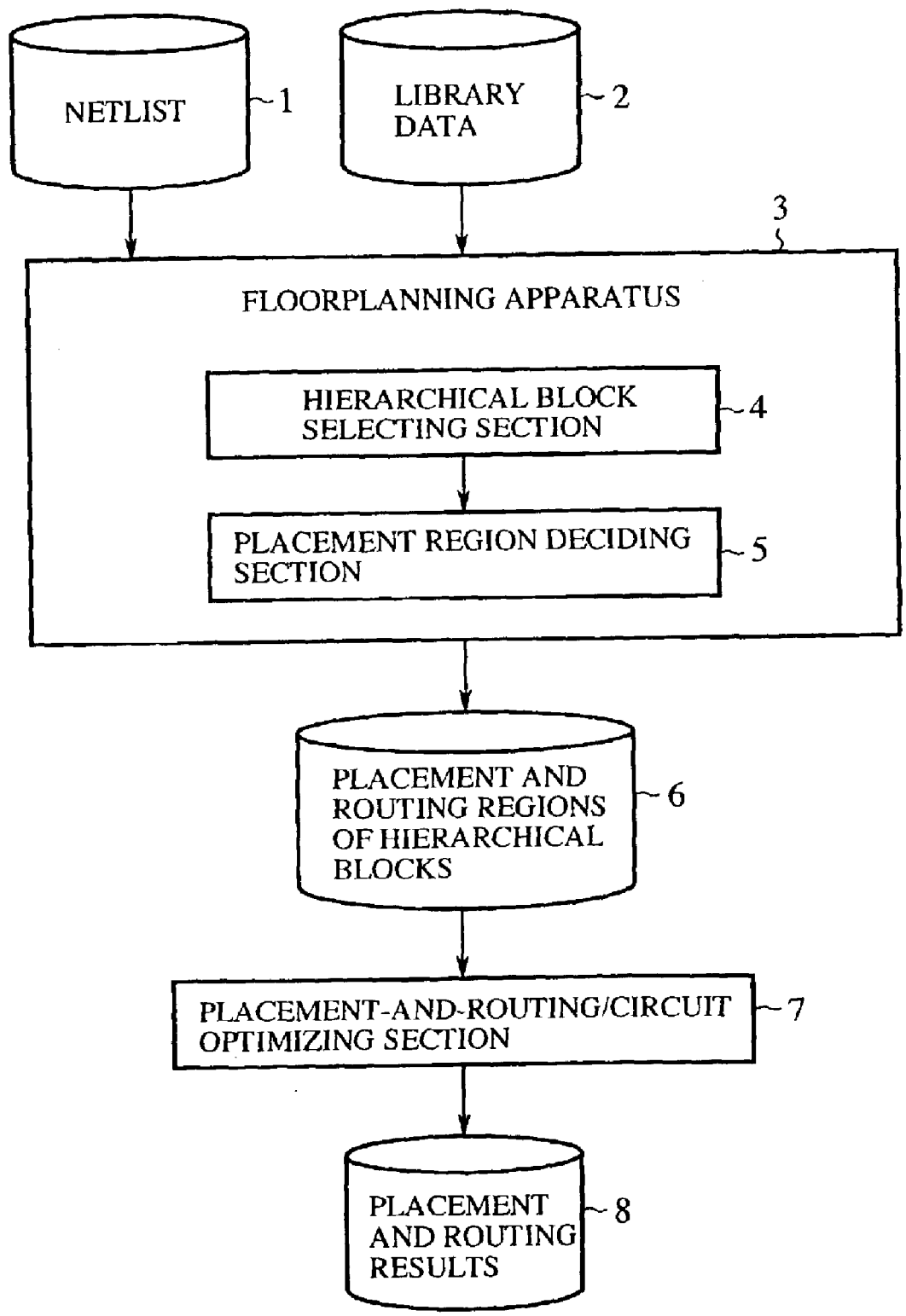
FIG. 11 is a block diagram showing processing of a conventional floorplanning apparatus.

More specifically, as illustrated in FIG. 10, the hierarchical block selecting section 14 selects the highest level hierarchical block, first (step ST12). After the logic seed placement section 15 to the placement region deciding section 17 complete their processing (step ST2–ST4), the hierarchical block selecting section 14 makes a decision as to whether the size of the hierarchical block whose placement and routing region is determined by the placement region deciding section 17 exceeds a predetermined upper limit size or not (step ST13).

When the size of the hierarchical block is within the upper limit size, the hierarchical block selecting section 14 completes the series of the processing. In contrast, when the size of the hierarchical block is greater than the upper limit size, it selects the next highest level hierarchical block (step ST14), and returns to step ST2.

In this way, the present embodiment 8 offers an advantage of being able to produce a quality floor plan in a short time even for a very large-scale chip.

What is claimed is:

1. A floorplanning apparatus comprising:

a seed position decision section for deciding, referring to circuit information about at least one hierarchical block to be placed on a semiconductor integrated circuit substrate, a placement position of a logic seed of each hierarchical block;

a cell placement section for placing cells belonging to the hierarchical block around the placement position of the logic seed decided by said seed position decision section, referring to the circuit information about the hierarchical block corresponding to the logic seed; and a placement region decision section for deciding placement and routing regions of the hierarchical block considering cell placement results produced by said cell placement section.

2. The floorplanning apparatus according to claim 1, wherein said seed position decision section decides a placement position of the logic seed whose size is smaller than a mesh size of a grid used for carrying out placement and routing of the cells.

3. The floorplanning apparatus according to claim , wherein when the circuit information about the hierarchical block includes a timing restriction on a signal delay between the cells, said seed position decision section and said cell placement section make a decision of the placement position of the logic seed and of the cell placement considering the timing restriction.

4. The floorplanning apparatus according to claim 1, wherein when the circuit information about the hierarchical block includes weighting information about various signals, said seed position decision section and said cell placement section make a decision of the placement position of the logic seed and of the cell placement considering the weighting information.

5. The floorplanning apparatus according to claim 1, further comprising a generation acceptance section for accepting generating circuit information of a hierarchical block when the circuit information about the hierarchical block is undefined.

6. The floorplanning apparatus according to claim 1, wherein said cell placement section recognizes a crowding level of wiring referring to the circuit information about the hierarchical block, and adjusts a cell concentration in accordance with the crowding level of wiring.

7. The floorplanning apparatus according to claim 1, wherein said seed position decision section decides the placement position of the logic seed and said cell placement section carries out the cell placement, both considering a placement position of a hard macro.

8. The floorplanning apparatus according to claim 1, wherein said seed position decision section generates a hierarchical block equivalent in size to a hard macro, and decides the placement position of the logic seed of the hierarchical block, and wherein said cell placement section carries out the cell placement of the hierarchical block, and subsequently replaces the hierarchical block by the hard macro.

9. The floorplanning apparatus according to claim 1, further comprising a hierarchical block selecting section for selecting a higher level hierarchical block prior to a lower level hierarchical block when selecting a hierarchical block to be processed, wherein said seed position decision section, said cell placement section and said placement region decision section decide the placement and routing region of the selected high level hierarchical block, and subsequently said hierarchical block selecting section selects the lower level hierarchical block, and said seed position decision section, said cell placement section and said placement region decision section decide the placement and routing region of the selected lower level hierarchical block.

10. The floorplanning apparatus according to claim 1, wherein the seed position decision section determines the number of signal lines across individual hierarchical blocks.

11. The floorplanning apparatus according to claim 10, wherein the seed position decision section places two hierarchical blocks, with a large number of signal lines therebetween, close to each other.

12. The floorplanning apparatus according to claim 10, wherein the seed position decision section places two hierarchical blocks, with critical signal delay therebetween, close to each other.

13. The floorplanning apparatus according to claim 1, wherein the seed position decision section determines placement position based upon number of signal lines and signal delay between hierarchical blocks.

14. The floorplanning apparatus according to claim 1, wherein the cell placement section places cells based upon number of signal lines and signal delay between individual cells.

* * * * *

UNITED STATES PATENT AND TRADEMARK OFFICE
CERTIFICATE OF CORRECTION

PATENT NO. : 6,938,232 B2
DATED : August 30, 2005
INVENTOR(S) : Ken Saito et al.

It is certified that error appears in the above-identified patent and that said Letters Patent is hereby corrected as shown below:

Column 8,
Line 39, after "claim", insert -- 1 --.

Signed and Sealed this

Twenty-first Day of February, 2006

JON W. DUDAS
*Director of the United States Patent and Trademark Office*